(12) United States Patent
Soreff et al.

(10) Patent No.: US 8,201,120 B2
(45) Date of Patent: Jun. 12, 2012

(54) TIMING POINT SELECTION FOR A STATIC TIMING ANALYSIS IN THE PRESENCE OF INTERCONNECT ELECTRICAL ELEMENTS

(75) Inventors: Jeffrey P. Soreff, Poughkeepsie, NY (US); Barry Lee Dorfman, Austin, TX (US); Jeffrey G. Hemmett, St. George, VT (US); Ravichander Ledalla, Fishkill, NY (US); Vasant Rao, Fishkill, NY (US); Fred Lei Yang, Fremont, CA (US)

(73) Assignee: International Business Machines Corporation, Armonk, NY (US)

( * ) Notice: Subject to any disclaimer, the term of this patent is extended or adjusted under 35 U.S.C. 154(b) by 306 days.

(21) Appl. No.: 12/652,338

(22) Filed: Jan. 5, 2010

(65) Prior Publication Data
US 2011/0167395 A1  Jul. 7, 2011

(51) Int. Cl.
*G06F 17/50* (2006.01)
*G06F 9/455* (2006.01)

(52) U.S. Cl. ....................... 716/108; 716/113
(58) Field of Classification Search .................. 716/108, 716/113
See application file for complete search history.

(56) References Cited

U.S. PATENT DOCUMENTS

| 5,305,229 | A | 4/1994 | Dhar | |
|---|---|---|---|---|
| 5,796,621 | A * | 8/1998 | Dudley et al. | 716/103 |
| 6,507,807 | B1 | 1/2003 | McBride | |
| 7,047,506 | B2 * | 5/2006 | Neves et al. | 716/113 |
| 7,155,691 | B2 * | 12/2006 | Ratzlaff | 716/108 |
| 7,213,221 | B1 | 5/2007 | Celik et al. | |
| 7,661,080 | B2 * | 2/2010 | Papadopoulou et al. | 716/136 |
| 7,849,429 | B2 * | 12/2010 | Hemmett et al. | 716/113 |
| 2005/0108665 | A1 * | 5/2005 | Neves et al. | 716/2 |
| 2007/0113211 | A1 * | 5/2007 | Zhang et al. | 716/6 |
| 2008/0046851 | A1 | 2/2008 | Miczo | |
| 2008/0178137 | A1 * | 7/2008 | Papadopoulou et al. | 716/13 |
| 2008/0209373 | A1 * | 8/2008 | Buck et al. | 716/6 |
| 2009/0125852 | A1 * | 5/2009 | Papadopoulou | 716/4 |
| 2009/0288051 | A1 * | 11/2009 | Hemmett et al. | 716/6 |
| 2009/0327985 | A1 * | 12/2009 | Chen et al. | 716/6 |

OTHER PUBLICATIONS

Mount, David M., "CMSC 451 Design and Analysis of Computer Algorithms", Dept. of Computer Science, University of Maryland, Fall 2003, pp. 1-135.*
Teslenko, M. et al., "An efficient algorithm for finding double-vertex dominators in circuit graphs", Mar. 7, 2005, Design, Automation and Test in Europe, 2005, Proceedings. vol. 1, pp. 406-411.*

* cited by examiner

*Primary Examiner* — Stacy Whitmore
(74) *Attorney, Agent, or Firm* — H. Daniel Schnurmann

(57) ABSTRACT

A method and a system for selecting timing points in an electrical interconnect network to be used in electrical simulations for a static timing analysis for improved accuracy. The present method includes discovering choke points in an electrical model of the interconnect for which all the paths from drivers to receivers must pass through on certain types of nets. The method then uses the choke point electrical nodes, where they exist, as an output timing point of the logic gate driving the net. The method solves the problem of inaccuracies due to resistances between different driver pins on the same interconnect net, though it can also be applied to solving analogous inaccuracies due to resistances between different receiver pins associated with the same receiver timing point. It further also applies to interconnect with other two-port parasitic elements, to cases where only a subset of receiver pins on the net require accurate timing, and to cases where a set of electrical nodes, rather than a single node, partition all paths from drivers to receivers on a net.

21 Claims, 8 Drawing Sheets

ARTICULATION VERTICES ARE THOSE WHICH DISCONNECT AN UNDIRECTED GRAPH WHEN REMOVED

THE PARTITIONS OF THE GRAPH (INCLUDING SEPARATE COPIES OF THE ARTICULATION VERTICES) ARE CALLED BICONNECTED COMPONENTS.

US 8,201,120 B2

TIMING POINT SELECTION FOR A STATIC TIMING ANALYSIS IN THE PRESENCE OF INTERCONNECT ELECTRICAL ELEMENTS

FIELD OF THE INVENTION

The present invention relates to the field of Electronic Design Automation, and, more particularly, to a method and a system for performing a static timing analysis on digital transistor circuits using embedded simulation.

BACKGROUND

For many years, the performance of digital machine designs has been evaluated by performing static timing analysis on the designs. Timing analysis is a design automation tool which provides an alternative to the hardware debugging of timing problems. The program is intended to establish whether all the paths within the design meet stated predetermined timing criteria, i.e., whether data signals arrive at storage elements early enough for a valid capture, but not so early as to cause premature capture.

Propagation Segments, Timing Points, and Timing Graph:

Static timing analysis (STA) of digital systems has been used for decades to analyze the performance of digital designs. When performing an STA, elements of the design which can delay signals, such as logic gates, wires, and combinations thereof, are represented by propagation segments, also referred to as 'psegs', and which represent the delays of the elements. The prior art includes systems where delays are preferably determined by circuit simulations, as well as systems where delays are computed by various approximations to a simulated result. Each pseg includes two timing points, a "from" timing point representing an input to the delay element and a "to" timing point representing an output of the delay element. The timing graph of the design as a whole includes a full set of all the timing points and psegs of all logic gates, wires, and other delay elements in the design.

One conventional formulation of analysis partitions delays of the system into logic gate delays and interconnect delays, which are represented by propagation segments. An example thereof is shown in the relationship between an example of a combinational network, shown in FIG. 1 and a corresponding example of the formulation of a timing model shown in FIG. 2. For example, the delays of the NAND logic gate g4 in FIG. 1 are represented by three propagation segments shown in FIG. 2 from g4_i1 to g4_o, from g4_i2 to g4_o, and from g4_i3 to g4_o, referred to as an input to output to input or net/gate/net timing model.

Transistor Pins, Drivers, Receivers, Nets, Electrical Nodes

The representation generally views the output of a logic gate as a single point in the timing graph. Electrically, however, the logic gates consist of many transistors with many output electrical nodes. For example, referring to FIG. 3A, the inverter g1 and its input and output timing points g1_i and g1_o represent an approximate view of the electrical system shown in FIG. 3B. Herein, timing point g1_i can represent either of electrical nodes c or d, the gates of transistors p1 or n1, respectively. Similarly, timing point g1_o can represent either of electrical nodes e or g, the drains of transistors p1 or n1, respectively. A transistor pin can refer to a transistor gate, source, or drain. At the electrical circuit level of representation, each transistor pin is an electrical node in the circuit. Other electrical nodes in the circuit, such as a, b, f, or h, in FIG. 3B can be connected to other electrical elements, such as the resistors shown. A logical net is all the electrical nodes connected by resistors (or inductors), such as e, f, g, and h (FIG. 3B) and all the electrical elements interconnecting them. They represent one interconnect net at the electrical level. Alternatively, an interconnect net is the set of all the electrical nodes having DC connections and which will reach very similar voltages, if the circuit is operated slowly.

FIG. 4 illustrates in more detail gates g4, g5, g6, and g7 and the interconnect net between them. Shown is a resistive interconnect network linking electrical nodes a, b, c, d, e, f, g, h, i, j, k, l, and m, showing an example of an interconnect net to which the invention applies. Gate g4 is the driver of the interconnect net, and gates g5, g6, and g7 are receivers of the net. The output of gate g4 and the inputs of gates g5, g6, and g7 are logical ports of the net, i.e., places through which logic signals travel. Two of the logical ports include several electrical nodes. The driving logical port of the net, i.e., the output of gate g4 contains electrical nodes a, b, c, and d. One of the receiving logical ports of the net, the input to gate g7, includes electrical nodes l and m. It is possible for a logical port on a net to contain only a single electrical node. The input to gate g5 illustrates this possibility in the figure, and shows a receiving logical port consisting of only the single electrical node j.

Transistor pins which can pull the voltage of an interconnect net up or down (channel pins—either sources or drains) are considered driver pins, since they drive a logical signal into the net. Transistor gate pins sensing the voltage on an electrical node of an interconnect net are considered receiver pins, since they receive a logical signal from the net. At a coarser level of analysis, the logic gate inputs are also receivers on the nets to which they are connected, and logic gate outputs are also drivers on the nets to which they are connected. Additional drivers and receivers exist on nets at the boundary of the system under analysis. An input to the system under analysis (i.e., a primary input or PI) is a driver of the interconnect net that it is on. An output of the system under analysis (i.e., a primary output or PO) is a receiver of the interconnect net that it is on.

In an STA with an embedded simulator, the delay through a pseg is measured by applying a voltage waveform at an electrical node chosen as representing the "from" timing point of the pseg and measuring the voltage that the circuit simulation produced at an electrical node chosen to represent the "to" timing point of the pseg. More generally, the voltage applied to the "from" end may be applied to several electrical nodes.

Typically, one of the transistor pins is selected as "the" output timing point for a logic gate, resulting in numerical inaccuracies in the calculation of system delays through both the logic gate and the interconnect that it drives. A simplified example of the source of the inaccuracy is shown with reference to FIG. 5. Therein, an inverter consisting of pFET p1 and nFET n1 drives a net comprising electrical nodes b, c, and d and resistors r1 and r2. An example of the inaccuracy can occur if node b, the drain of pFET p1, is chosen to represent the output of the inverter. Considering the case of a rising input propagating through the inverter, the bulk of the electrical effect of the inverter on the output net is produced by nFET n1. The delay from the input of the inverter to its output is measured from electrical node a, through the intrinsic delay of nFET n1 (effectively to electrical node c, n1's drain), then backwards through r1 to node b. The delay through the net is then calculated forwards from node b through r1 (to node c) and through r2 to the receiver node d. The total delay through the two psegs, both logic gate and net, therefore counts the delay through r1 twice. Physically, however, the rising signal applied to the inverter input only needs to propagate through the nFET n1 to electrical node c, n1's drain, then through r2 to the receiver on electrical node d. This illustrates the primary prior art limitation.

A second prior art formulation of the static timing analysis is a "simulate-to-sinks" approach or input to input approach. An example thereof is shown in the relationship between an example of a combinational network, shown in FIG. 6A and a corresponding example of a "simulate-to-sinks" timing model shown in FIG. 6B. FIG. 6A illustrates logic gate g4, the interconnect net that gate g4 drives, and receiver logic gates g5, g6, and g7 on the net. FIG. 6B shows all the psegs derived from logic gate g4 and the following interconnect net. The psegs extend from all the inputs of gate g4, timing points g4_i1, g4_i2, and g4_i3 to all the receivers on the net it drives, timing points g5_i, g6_i, and g7_i. The second conventional approach avoids the inaccuracy due to resistances between the driving transistor pins of a logical net by including all of these pins within a single electrical simulation. The limitation of the methodology is that it increases the number of psegs needed. Generally, an M-input gate driving a net with N receivers needs M+N psegs to model it in the input-to-output-to-input approach, but M×N psegs in the input-to-input approach.

Biconnected Components and Articulation Vertices:

A biconnected graph (or component in an undirected graph) is a set of vertices and edges such that every pair of vertices in the set has at least two disjoint paths between them. An articulation vertex is a vertex in an undirected graph whose removal breaks up the graph into disconnected pieces. Biconnected components cannot be broken up into disconnected pieces by removal of a single vertex.

FIG. 7 illustrates what the partitioning of an undirected graph into biconnected components and articulation vertices does. The undirected graph with vertices a, b, c, d, e, f, g, h, i, j in FIG. 7A has only one vertex, c, which breaks the graph up into disconnected pieces if removed. The vertex is the sole articulation vertex for the graph. Splitting it up into two copies, c1 and c2, yields the two biconnected components, a, b, c1, d, e, and c2, f, g, h, i, j shown in FIG. 7B.

BRIEF DESCRIPTION OF THE DRAWINGS

The accompanying drawings, which are incorporated in and which constitute part of the specification, illustrate the presently preferred embodiments of the invention which, together with the general description given above and the detailed description of the preferred embodiments given below serve to explain the principles of the invention.

SUMMARY

Figure 1:
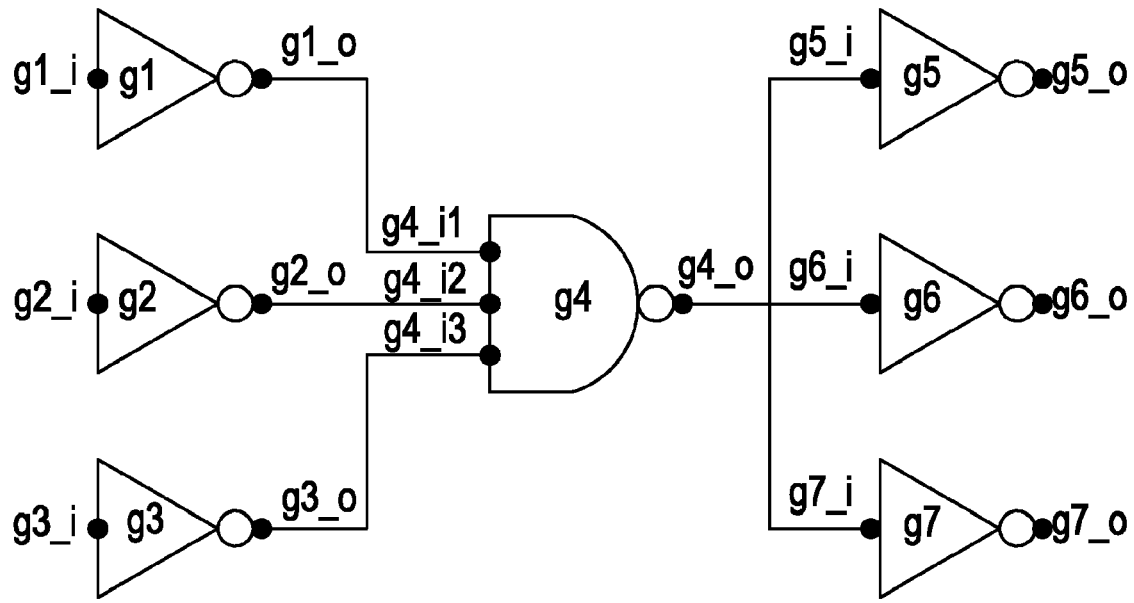
FIG. 1 is an example of a prior art combinational network.
Figure 2:
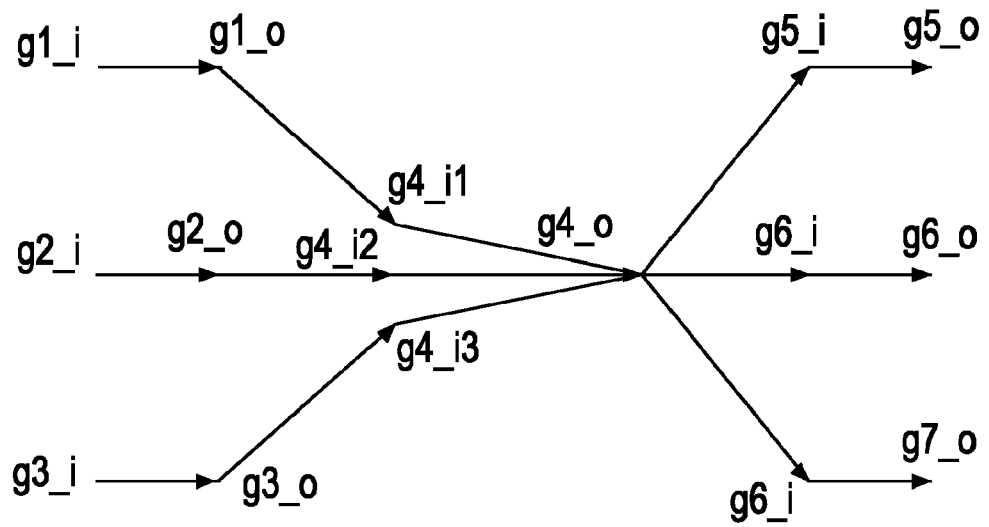
FIG. 2 illustrates a prior art gate/net/gate pseg timing model.
Figure 3A:
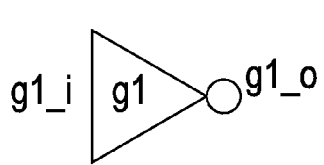
FIGS. 3a-3b show an example of the correspondence of a gate view and an electrical view of a conventional gate.
Figure 3B:
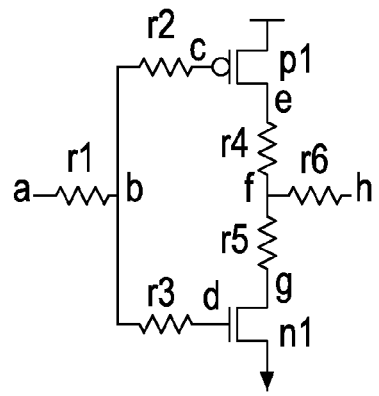

The objects, aspects and advantages of the invention are achieved by a method and a system for improving the accuracy of the static timing analysis in instances where there are resistances or other two-port parasitic elements between multiple transistor pins, and where certain topological criteria are true of the interconnect network.

In one embodiment of the invention, the method selects timing points in static timing analysis in the presence of an interconnect by choosing the timing points from electrical nodes which, if removed, would separate all the driving electrical nodes on the logical network from all the receiving electrical nodes on the logical network. The "choke points" improve the accuracy of the delay calculation because all electrical effects of the output must funnel through the electrical node; therefore, choosing a choke point as the driver output timing point for a logic gate captures all the effects of any resistances between driver transistor pins. The existence of one or more electrical nodes meeting this condition is the topological criterion for the interconnect network which primarily determines the applicability of the inventive method. The embodiment, as described, applies not only to interconnect resistors, but also to interconnect electrical models containing any two-terminal parasitic elements between the driving transistor pins and the receiving transistor pins. Resistors, inductors, and coupling capacitors (though not grounded capacitors) can all be used as edges in the graph.

In another embodiment, the invention chooses the choke point closest to the driver biconnected component along the path from the driver component to the receiver component. While any of the choke points along the path can be selected as a timing point, in order to improve accuracy, choosing the one closest to the driver component has the further advantage of keeping the partitioning of the delays between gate psegs and net psegs as close to the prior art as possible.

In still another embodiment, the invention provides a method and system for separating driving electrical nodes from a relevant subset of receiving electrical nodes, in which the receiving nodes that are only used for feedback or which are irrelevant to the timing analysis, are excluded.

In a further embodiment, the invention enables discovering interconnect net bottlenecks, sets of electrical nodes, rather than purely single nodes, which separate the net drivers from the receivers. Regarding the bottlenecks (not to be confused with choke points), in one embodiment, repeated searches are made for "choke points" in the interconnect network, interleaved with reducing the networks in ways that can create "choke points" (such as shorting resistors) in the event that none have yet been found.

In still a further embodiment, the invention selects receiver timing points and improves the numerical accuracy of delay calculations to these points in the design. Furthermore, an analogous approach finds choke points between all the transistor pins which include one of the receiver timing points on a logical net and all the other transistor pins in the net. Alternatively, just as a numerically accurate timing point for the driver can be found by finding a choke point electrical node between all electrical driving nodes in the driver and all receiving electrical nodes on the net, one can similarly find a numerically accurate choke point electrical node for a particular receiver. This is achieved by finding a choke point electrical node between the receiver electrical nodes for the particular receiver and all other receiver or driver electrical nodes in the net. Thus, timing points for a logical port (either driver or receiver) are chosen from the electrical nodes which separate the logical port (and its electrical nodes) from all the other logical ports in the net (and corresponding electrical nodes). These points, wherever they exist, can be used to eliminate errors due to parasitic electrical elements between the transistor pins comprising a receiver timing point.

In yet another embodiment, a method and a system are provided for selecting timing points in an electrical interconnect network to be used in electrical simulations used in a static timing analysis (STA) to improve the numerical accuracy of the STA, the method including: a) inputting the interconnect network and converting it into a graph; b) augmenting the graph by adding a set of edges to connect all the vertices of the selected logical port and another set of edges to connect all the vertices of all the other logical ports; c) partitioning the graph into biconnected components and articulation vertices; d) determining if the selected logical port's biconnected component is separate from the other ports' biconnected component, and if the components are separate, then selecting an articulation vertex on a path from the first component to the second component as a timing point for the first component; and e) incorporating the selected articulation vertex into the selected port's timing point.

DETAILED DESCRIPTION

Detailed embodiments of the present invention are disclosed herein. However, it is to be understood that the disclosed embodiments are merely illustrative of the invention that may be embodied in various forms. In addition, each of the examples given in connection with the various embodiments of the invention is intended to be illustrative, and not restrictive.

In the following description, and for the purpose of explanation, specific details are set forth in order to provide a thorough understanding of various aspects of the invention. It will be apparent to those skilled in the art that the present invention may be practiced without those specific details. In other instances, well-known structures and devices are shown in block diagram to avoid unnecessarily obscuring the present invention. Therefore, specific structural and functional details disclosed herein are not to be interpreted as limiting, but merely as a representative basis for teaching one skilled in the art how to variously employ the present invention.

In one embodiment, the inventive method improves the accuracy of the static timing analysis in cases where there are resistances between multiple transistor pins and where a topological condition to be described hereinafter holds for the interconnect network. Previous existing solutions pick a single transistor pin to represent, e.g., an output static timing point for a channel connected component (CCC), resulting in either optimistic or pessimistic errors in the timing analysis.

Figure 8:
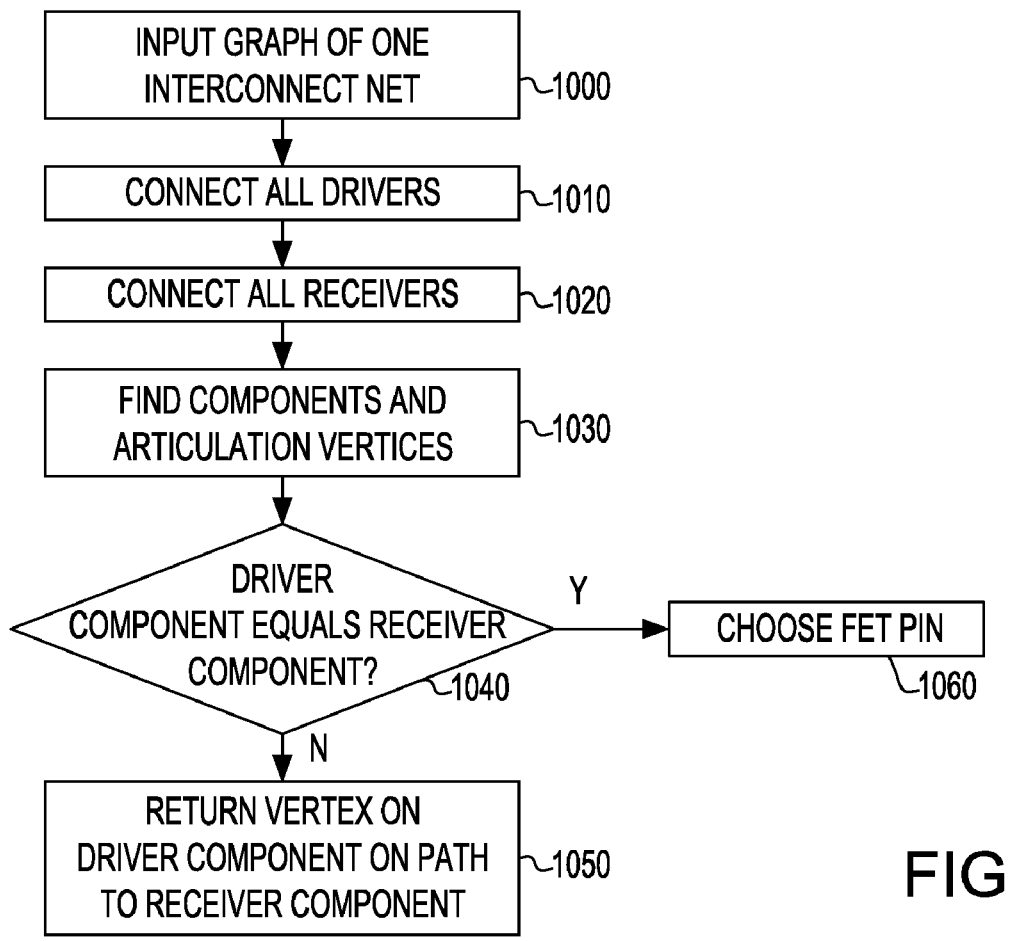
FIG. 8 is a flowchart illustrating a choke point discovery, according to an embodiment of the present invention.

Referring now to FIG. 8, a flow chart of one embodiment of the present invention is shown that illustrates some of the most important steps of the inventive method.

Step 1000: For a given logical signal net, capture the network as an undirected graph where the two-port parasitic elements are edges. The elements include resistances, inductances, coupling capacitances, wire models or any other two port electrical element. The electrical nodes in the interconnect electrical model are the vertices of the undirected graph.

Step 1010: Add additional edges to the undirected graph to connect all the driver transistor pins (or other drivers, such as logic gate outputs or system PIs). More specifically, it is only necessary to add edges between vertices where less than two disjoint paths between them already exist. One can similarly connect all the electrical nodes of a selected logical port.

Step 1020: Add additional edges to the undirected graph between receiver transistor pins (and other receivers, such as gate inputs) like those in step 1010. One can similarly connect all the electrical nodes of all the other logical ports of the net.

Step 1030: Find the biconnected components and articulation vertices in the augmented undirected graph created in step 1020.

Step 1040: Determine if the biconnected component containing the drivers of the net is the same as the biconnected component containing the receivers of the net. If the components are the same, the network is too heavily interconnected for the invention to apply, in which case, fallback to prior art techniques (Step 1060) is acceptable. One can similarly determine if the component for the selected logical port is the same as the component for all the other logical ports on the net.

Step 1050: Find the articulation vertex (the electrical node in the interconnect net) which is on the driver biconnected component and on the path from the driver component to the receiver component. Return the electrical node as the node to be used as the driver output timing point. One can similarly find the vertex in the path from the selected logical port's component to the other ports' component and return it to be used as the selected port's timing point.

Step 1060: Select one of the logical port's transistor pins as the port's timing point.

When the process is successful at finding a 'choke point' on an interconnect net, the choke point in the electrical simulations of the timing analysis is preferably used. Furthermore, when measuring the delay to this point, the delay from the usual voltage crossing (typically 50%) on the input of the driving CCC to the usual voltage crossing of the waveform at the choke point is measured. When measuring the delays from this point, the delay from the usual voltage crossing on the choke point, which is now the input of the interconnect net, to the usual voltage crossings of the receivers, i.e., the outputs of the interconnect net, are measured.

Note that one does not want to simply break the unmodified graph of, e.g., resistors in an interconnect net up into articulation vertices and biconnected components. If the step were applied to, e.g., the interconnect shown in FIG. 4, one would find that, e.g., node e would be an articulation vertex, because removing it separates node a from the rest of the graph, leaving the partitioning too finely grained for the purposes of the invention, since the only interest of the articulation vertices is to separate all the drivers from all the receivers or, more generally, to separate the selected logical port from all the other logical ports.

Figure 4:
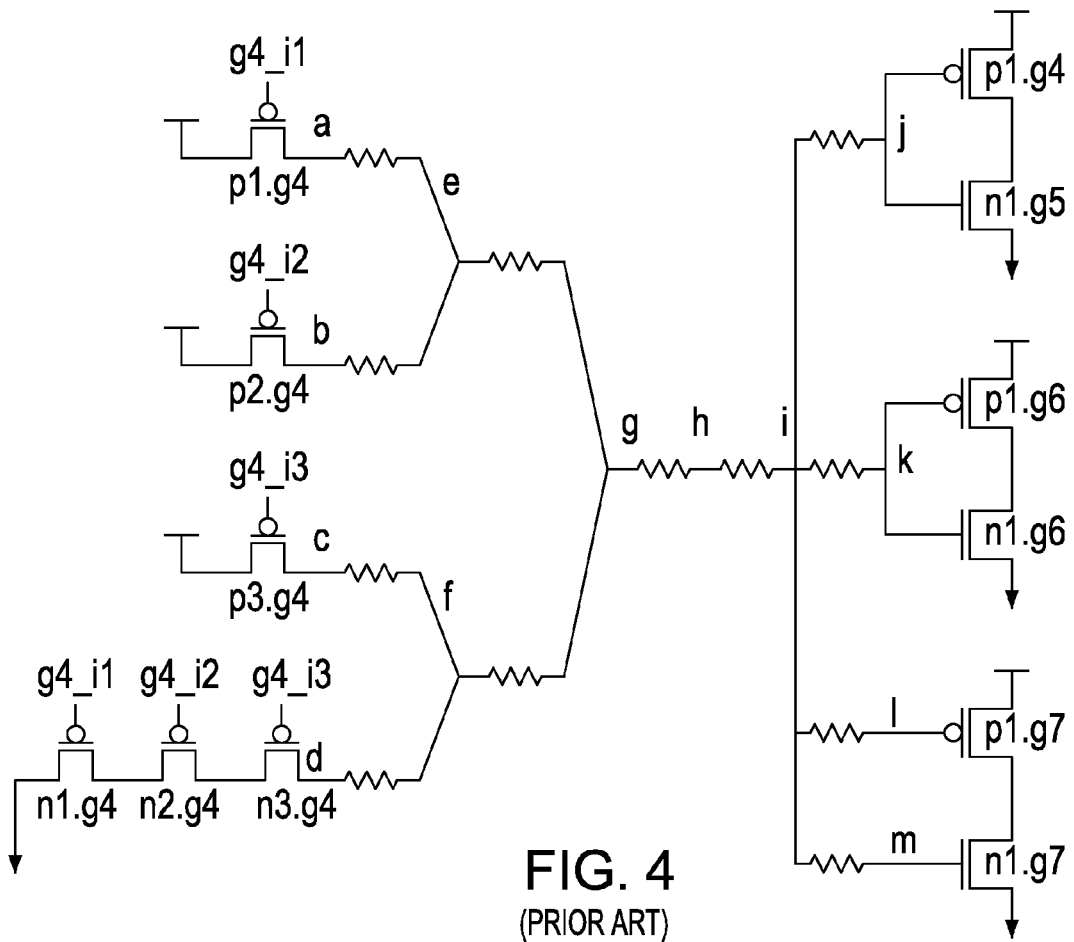
FIG. 4 is an example of a prior art resistive interconnect network.
Figure 5:
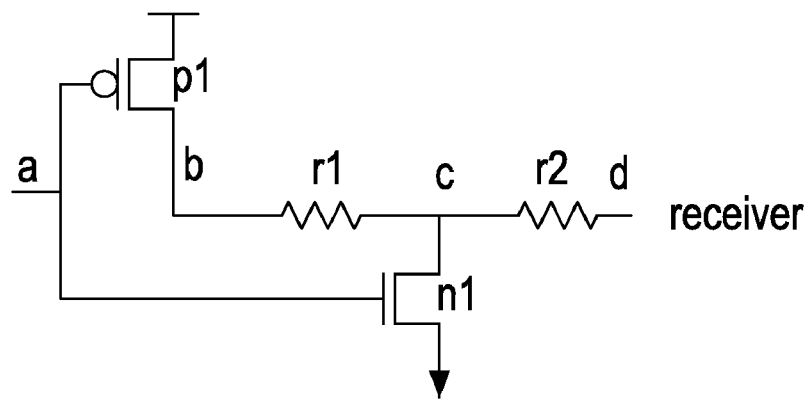
FIG. 5 is an example of a prior art error source.
Figure 6A:
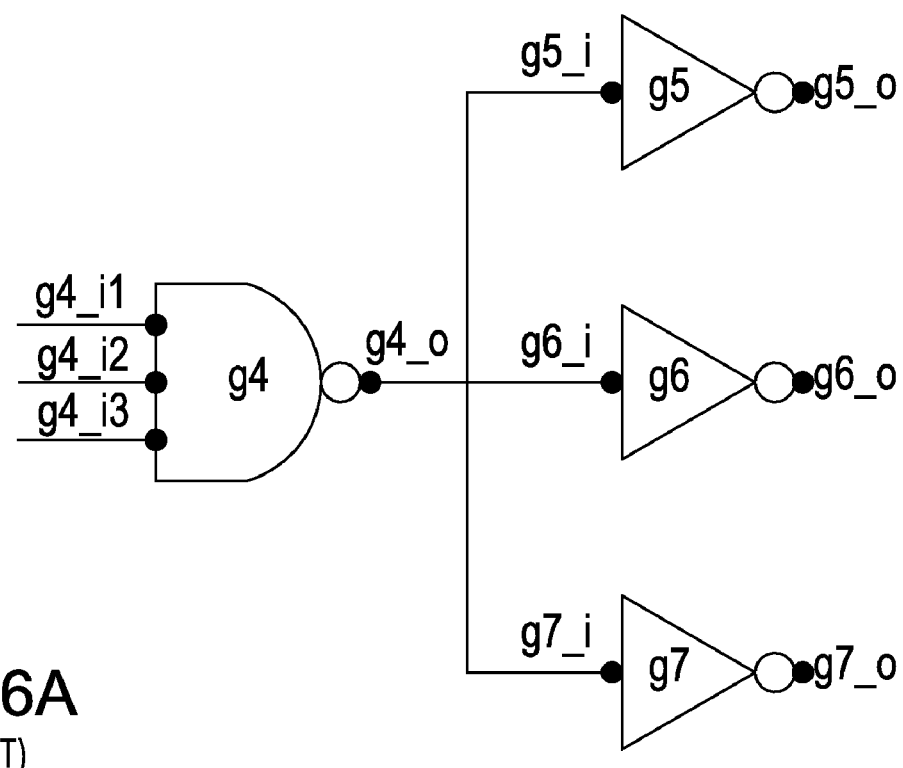
FIGS. 6a-6b illustrate an example of a prior art simulate-to-sinks timing model.
Figure 6B:
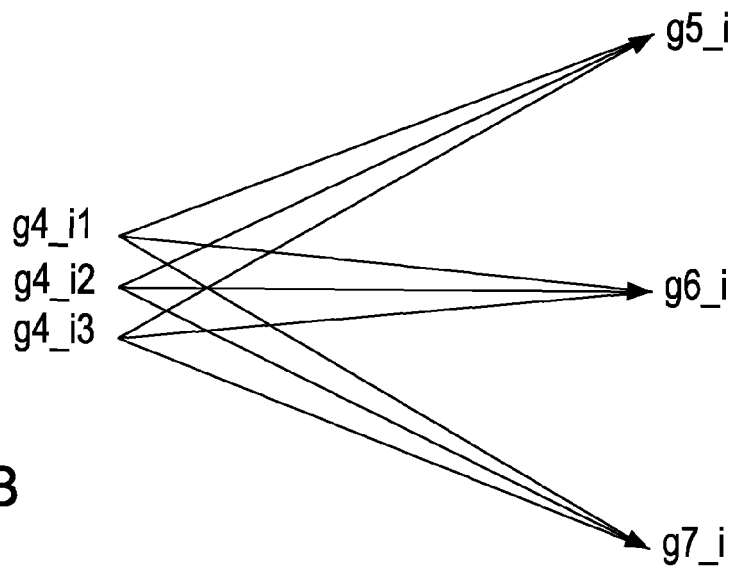
Figure 7A:
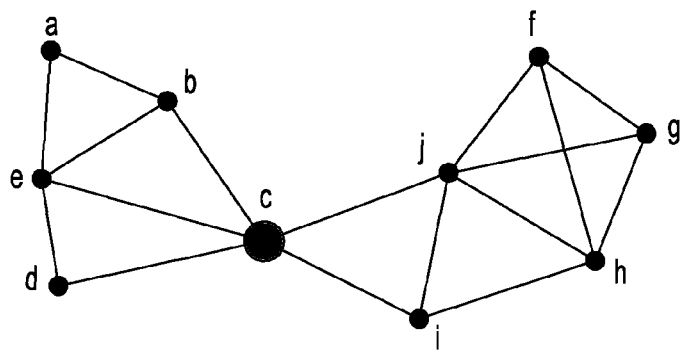
FIGS. 7a-7b depict an example of partitioning a prior art undirected graph into biconnected components and articulation vertices.
Figure 7B:
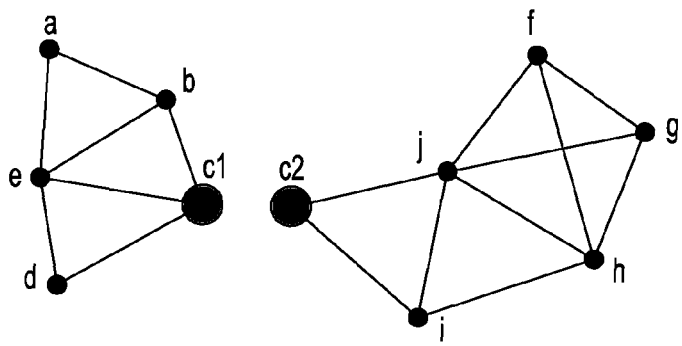
Figure 9:
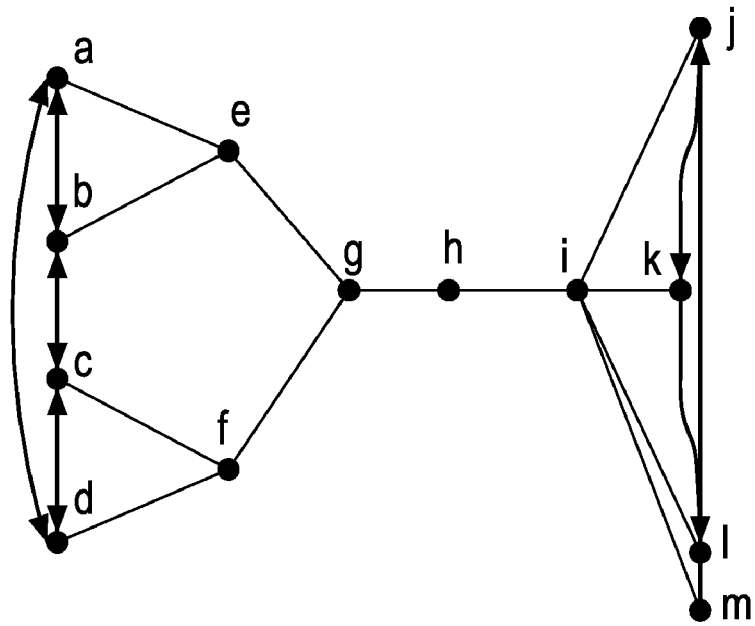
FIG. 9 is an example of an augmented graph of an interconnect network, according to one embodiment of the invention.

FIG. 9 shows the resistive network of FIG. 4 after being converted to an undirected graph and augmented by additional edges between the drivers (e.g., where the driver port is the selected logical port), and by additional edges between the receivers. Alternatively, it is the product of steps 1000, 1010, and 1020 operating on FIG. 4. The augmented edges are represented by thick double-headed arrows between nodes a and b, b and c, c and d, d and a on the driver side, and between j and k, k and l, l and m, and m and j on the receiver side. All remaining edges represent resistors of the original interconnect net.

Figure 10:
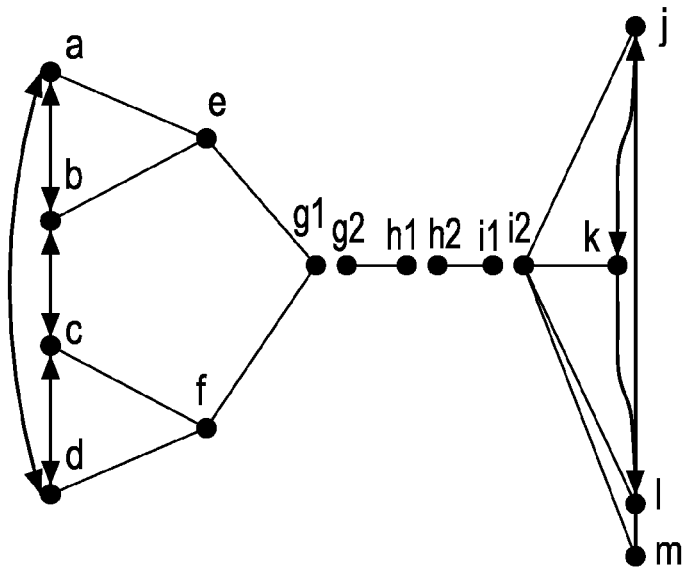
FIG. 10 is an example of partitioning an augmented graph of an interconnect network into biconnected components and articulation vertices, according to one embodiment of the invention.

FIG. 10 shows the undirected graph after being broken into biconnected components. The driver component consists of a, b, c, d, e, f, g1, while the receiver component consists of i2, j, k, l, and m, leaving the two remaining components g2, h1 and h2, i1 between them, the product of step 1030 operating on FIG. 9.

The driver component, a, b, c, d, e, f, g1 differs from the receiver component i2, j, k, l, m so that step 1040 branches to step 1050. Step 1050 finds that the vertex g1 representing the electrical node g is the articulation vertex of the driver component along the path to the receiver component, the method of the present invention establishes that it becomes the electrical node to be used as the output timing point of the driving gate g4.

Figure 11:
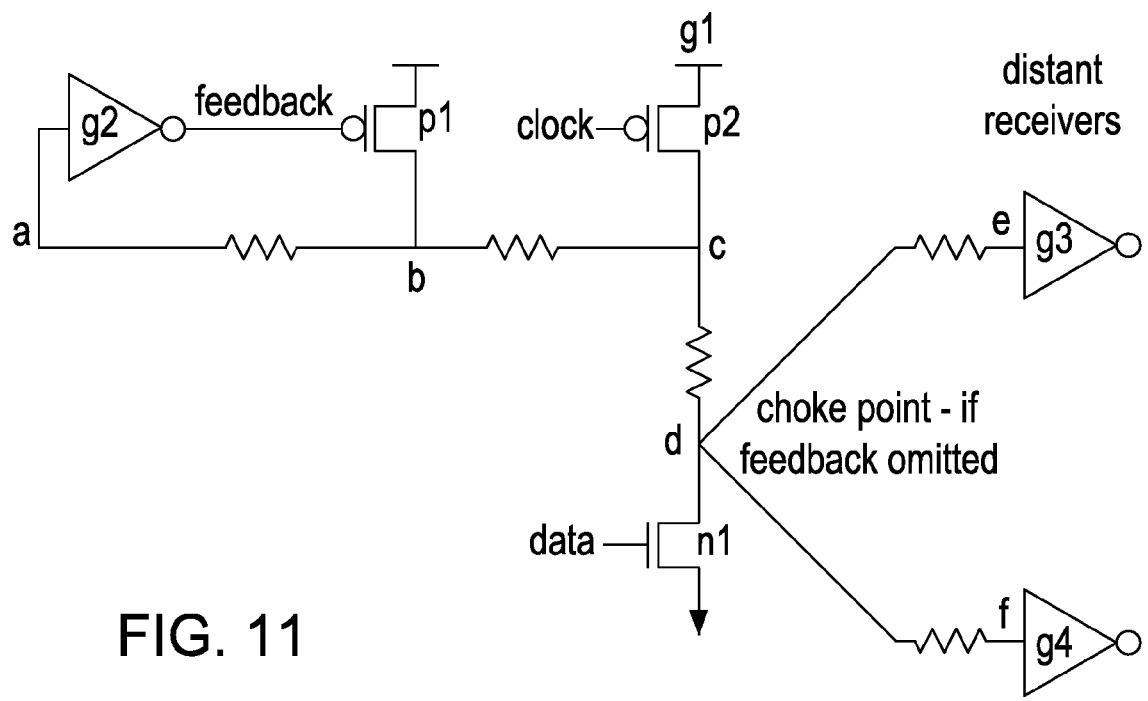
FIG. 11 illustrates an example of a network, where excluding a feedback inverter from the receivers enables selecting a choke point, according to one embodiment of the invention.

FIG. 11 shows an example where an additional refinement to an embodiment of the invention is applied. In the discussion thus far, the choke point located separates all the drivers of the interconnect net from all the receivers of the net. The choke point can actually satisfy a weaker condition and still provide the accuracy improvement provided by the present invention. It suffices to separate the driver pins from the receiver pins which must be accurately simulated when simulating the propagation of a signal to the rest of the design. In the case of feedback structures, such as electrical node a driving inverter g2, which in turn drives back through the separate logical net feedback into transistor p1, becomes unnecessary. Instead, gate g1 (transistors p1, p2, and n1) can be simulated together with inverter g2 as one block, including electrical node a as part of the simulation. Another way to view the combined simulation is to view logic gate g1 as having been extended to include inverter g2, whose input a no longer needs to be considered as a receiver of net a, b, c, d, e, f. As a result of the combined simulation, electrical node a is no longer an input to the combined simulation, but is instead an internal node of the simulation. Since node a is no longer an input to a gate, it no longer requires timing information and no longer requires treatment as a receiver electrical node of the net. With the refinement, electrical node d now splits driving nodes c and d from the remaining receiver electrical nodes, e and f, and now acts as a choke point for the network.

Generally, the receivers that can be omitted from the choke point analysis may include any type of feedback to the driving logic gate, NANDs, NORs, and inverters. It can also include receivers which are known to be irrelevant to the timing analysis for other reasons, such as being turned off during a normal system operation.

Figure 12:
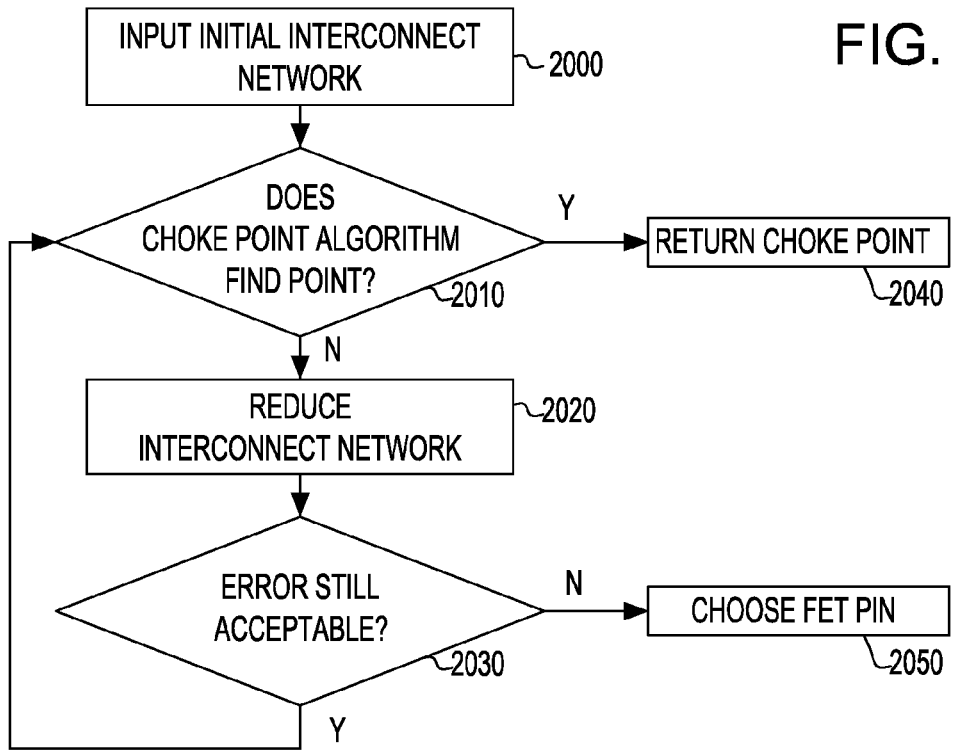
FIG. 12 is a flowchart illustrating an implementation of the algorithm for bottleneck discovery, according to one embodiment of the invention.

FIG. 12 shows an extension of the choke point detection that covers a more general case where there is a bottleneck in the interconnect net but not a choke point in the original graph. Assuming that there is a small set of electrical nodes which, if they are removed from the network, separate all the drivers from all the receivers of the network, even if none of them individually separate the sets. In such an instance, there may be cases where using one of the nodes at the timing point, or shorting them and using the shorted electrical node as the timing point, are still more accurate than the prior art. The steps in the process include step 2000 that captures the logical interconnect net as an undirected graph; and step 2010 that applies the method of FIG. 8 to the interconnect graph.

If the attempt to find a choke point in the interconnect graph succeeds, reaching the return step 1050 (FIG. 8), then the extended process also succeeds, proceeding through the Y branch of the decision block 2010 to the return step 2040. If the attempt to find a choke point fails and reaches step 1060 (FIG. 8), then, the process proceeds through the N branch of decision block 2010 to step 2020. Step 2020 reduces the interconnect network, and finds the smallest resistor (or, alternatively, the interconnect element with the shortest time constant) in the network and shorts it. It combines the two electrical nodes on the two ends of the resistor, and combines in parallel the appropriate network elements from the nodes to the shared neighboring nodes.

Decision block 2030 determines if the accumulated error of the partially shorted interconnect network is still acceptable. If too much error has accumulated, then the process follows the N branch to step 2050 and preferably falls back to using prior art by choosing an FET pin as the timing point. If the amount of error is still tolerable, then the process returns to step 2010 in an attempt to find a choke point in the partially shorted network.

Figure 13A:
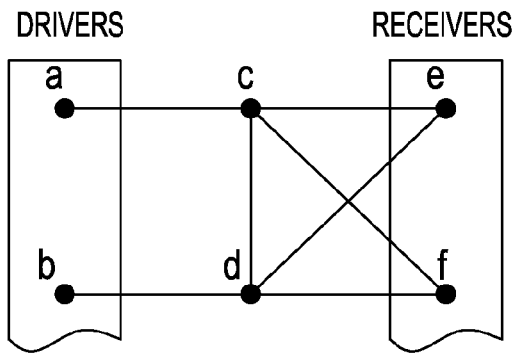
FIGS. 13a-13b show a graph of an interconnect network displaying a bottleneck, according to one embodiment of the invention.
Figure 13B:
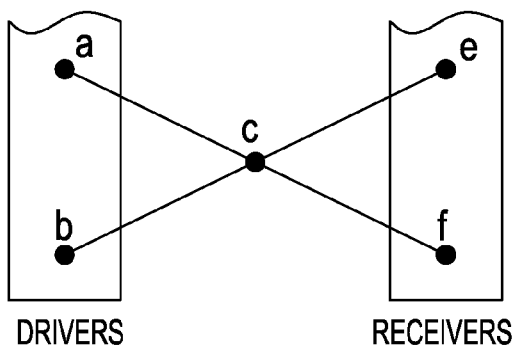

FIG. 13 shows an example of an interconnect network having a bottleneck and how the process shown in FIG. 12 discovers the bottleneck. Network a, b, c, d, e, f in FIG. 13A connects drivers a and b with receivers e and f, but no single vertex can be removed to separate all the drivers from all the receivers, so the initial network does not include the choke point. The network will be processed with steps 2000 and 2010 of FIG. 12, following the N branch to step 2020. Assume that the smallest resistor in the network is the one between nodes c and d. Step 2020 shorts the nodes, while keeping node c in the modified network in FIG. 13B. Correspondingly, it converts the edge between b and d in FIG. 13A into an edge between b and c in FIG. 13B. Similarly, the edge between c and e is combined with the one between d and e, yielding the edge between c and e in FIG. 13B and the same with the edges to f. If the resistance originally between c and d is found to be small, the error introduced by shorting will, likely, also be small. Then, decision block 2030 sends the modified network back to step 2010. Since node c now separates all the drivers from all the receivers, it will successfully locate the new choke point at c, which represents the bottleneck at c and d in the original network. The process then proceeds to step 2040 and returns the result.

Figure 14:
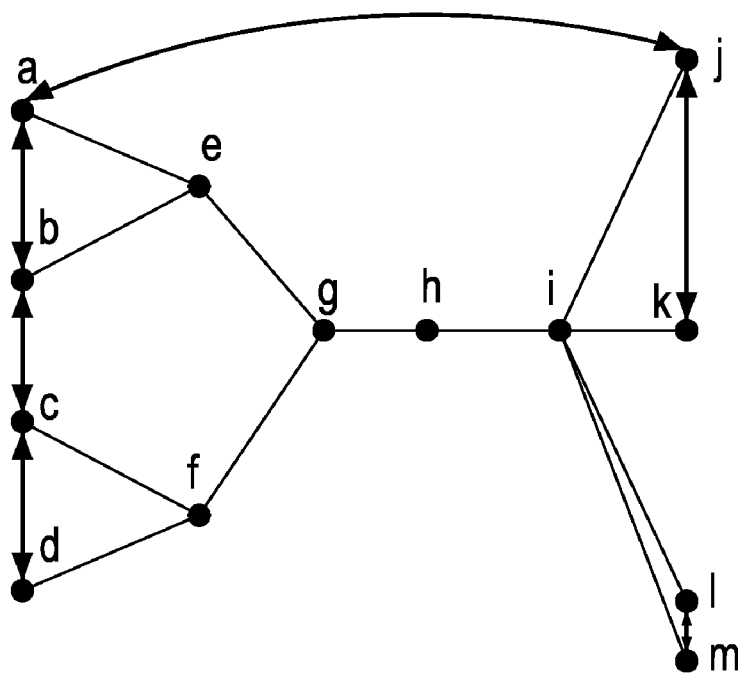
FIG. 14 shows an augmented graph of an interconnect network, according to one embodiment of the invention.

FIG. 14 shows the resistive network of FIG. 4 after being converted to an undirected graph and augmented by additional edges between the selected logical port and additional edges between all the vertices of the other logical ports. The selected logical port becomes an input of gate g7, a receiver in the net having electrical nodes l and m. The other logical ports are the driver, the output of gate g4 with electrical nodes c and d, the input to gate g5, a separate receiver, with electrical node j, and the input to gate g6, another separate receiver, with electrical node k. Alternatively, it is the product of steps 1000, 1010, and 1020 operating on FIG. 4 in the case where the selected logical port is the input of gate g7. Augmentation edges are represented by thick double-headed arrows between nodes l and m on the selected logical port side, and between c and d, b and c, a and b, j and a, and k and j on the side with all the other logical ports. All the other edges represent resistors in the original interconnect net.

Figure 15:
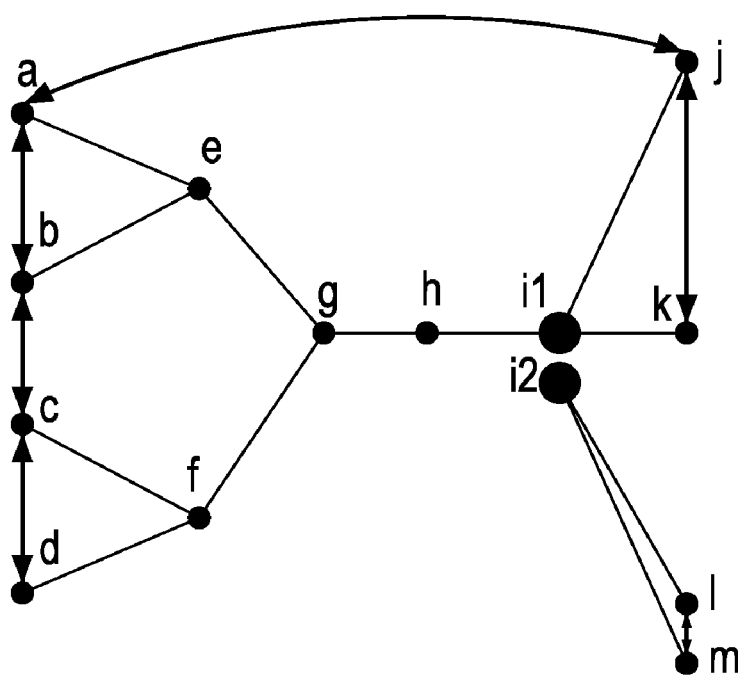
FIG. 15 is still another example of partitioning an augmented graph of an interconnect network into biconnected components and articulation vertices, according to one embodiment of the invention.

FIG. 15 shows the undirected graph after being broken into biconnected components in the case where the selected logical port is the input of gate g7. The selected logical port component consists of l, m, and i2, while the component with all other ports consists of a, b, c, d, e, f, g, h, i1, j and k. FIG. 15 shows the product of step 1030 operating on FIG. 14.

Selected receiver component, l, m, i2 differ from the other logical ports' components a, b, c, d, e, f, g, h, i1, j, k, accordingly, step 1040 branches to step 1050. In this case, step 1050 finds that the vertex i2 representing the electrical node i is the articulation vertex on the selected receiver component on the path to the other logical ports' component, the inventive method establishes that it becomes the electrical node to be used as the input timing point of the receiver logic gate g7.

The present method achieves a numerically more accurate timing point at a driving gate's output when compared to the prior art input to output to input method while avoiding an excessive number of psegs generated by the prior art input to input method.

The present invention can be realized in hardware, software, or a combination of hardware and software. The present invention can be realized in a centralized fashion in one computer system or in a distributed fashion where different elements are spread across several interconnected computer systems. Any kind of computer system—or other apparatus adapted for carrying out the methods described herein—is suitable. A typical combination of hardware and software could be a general purpose computer system with a computer program that, when being loaded and executed, controls the computer system such that it carries out the methods described herein.

The present invention can also be embedded in a computer program product, which comprises all the features enabling the implementation of the methods described herein, and which—when loaded in a computer system—is able to carry out the methods.

Computer program means or computer program in the present context mean any expression, in any language, code or notation, of a set of instructions intended to cause a system having an information processing capability to perform a particular function either directly or after conversion to another language, code or notation and/or reproduction in a different material form.

While the present invention has been particularly described in conjunction of a simple illustrative embodiment, it is to be understood that one of ordinary skill in the art that the foregoing and other changes in form and detail may be made therein without departing from the spirit and scope of the invention.

What is claimed is:

1. A method for selecting timing points in an electrical interconnect network used in electrical simulations in a static timing analysis (STA) to improve the numerical accuracy of the STA, the method comprising:
   a) using a computer, inputting the electrical interconnect network and converting it into a graph;
   b) augmenting the graph by adding a first set of edges to connect all vertices of a selected logical port and a second set of edges to connect all the vertices of all other logical ports;
   c) partitioning the graph into biconnected components and articulation vertices, wherein one biconnected component comprises all the vertices of the selected logical port, and a second biconnected component comprises all the vertices of all the other logical ports;
   d) determining if the selected logical port's biconnected component is separate from the other ports' biconnected component, and if the components are separate, then selecting an articulation vertex on a path from the first biconnected component to the second biconnected component as a timing point for the selected logical port; and
   e) incorporating the selected articulation vertex into the selected logical port's timing point, thereby improving the numerical accuracy of the STA.

2. The method as recited in claim 1 wherein the selected logical port of a net is a driver of the net, and the other logical ports are receivers of the net.

3. The method as recited in claim 1 wherein the selected logical port's biconnected component separate from the other port's biconnected component comprise edges and vertices of the graph.

4. The method as recited in claim 1 wherein said graph is an undirected graph.

5. The method as recited in claim 1 further comprising modifying a set of the other logical ports on the electrical network by omitting further selected logical ports from the set.

6. The method as recited in claim 5 wherein selecting logical ports includes receivers except those driving: a) feedback inverters; b) feedback NORs; c) feedback NANDs; and d) points determined to be unimportant for the STA.

7. The method as recited in claim 1 wherein in step d), if the selected logical port's biconnected component and the other logical ports' biconnected component are not separate, then the method further comprises:
   d1) reducing the electrical interconnect network;
   d2) evaluating an error in the reduced electrical interconnect network; and
   d3) if the error is acceptable, returning to step (a) in claim 1; and
   d4) if the error is unacceptable, choosing a selected port electrical node as a selected logical port's timing point.

8. The method as recited in claim 7 wherein reducing the electrical interconnect network includes shorting an electrical element within the electrical interconnect network.

9. The method as recited in claim 8 wherein selecting the electrical element to be shorted is made by choosing a most conductive remaining electrical element.

10. The method as recited in claim 9, wherein choosing the most conductive remaining electrical element includes choosing a smallest remaining resistor or inductor or a largest remaining coupling capacitor.

11. The method as recited in claim 7, wherein reducing the electrical interconnect network creates new choke points.

12. The method as recited in claim 7, further comprising performing multiple reductions and evaluations of the electrical interconnect network.

13. The method as recited in claim 1 wherein a net's selected logical port is a selected receiver of the net and the other logical ports are a driver of the net and any other receivers of the net.

14. The method as recited in claim 1 wherein electrical elements of an interconnect net are selected from (i) resistors; (ii) inductors; (iii) wire models; (iv) coupling capacitors; or (v) two-port electrical elements.

15. The method as recited in claim 1, further comprising selecting timing points in the STA when interconnects are present by selecting timing points from electrical nodes.

16. The method as recited in claim 15, wherein removing the electrical nodes separates all driving electrical nodes of a logical network from all receiving electrical nodes of the logical network.

17. The method as recited in claim 1, wherein the selected articulation vertex is in the selected logical port's biconnected component.

18. The method as recited in claim 1, wherein incorporating the selected articulation vertex into a selected port's timing point captures all electrical effects of resistances between electrical nodes of the selected logical port.

19. The method as recited in claim 1 further comprising discovering interconnect net bottle necks, and sets of electrical nodes separating net drivers from receivers.

20. A system for selecting timing points in an electrical interconnect network to be used in electrical simulations used in a static timing analysis (STA) to improve the numerical accuracy of the STA, the system comprising:
   a) using a computer, inputting the electrical interconnect network and converting it into a graph;
   b) augmenting the graph by adding a first set of edges to connect all vertices of a selected logical port and a second set of edges to connect all the vertices of all other logical ports;
   c) partitioning the graph into biconnected components and articulation vertices, wherein one biconnected component comprises all of the vertices of the selected logical port, and a second biconnected component comprises all of the vertices of all the other logical ports;
   d) determining if the selected logical port's biconnected component is separate from the other port's biconnected component, and if the components are separate, then selecting an articulation vertex on a path from a first component to a second component as a timing point for the first component; and
   e) incorporating the selected articulation vertex into a selected port's timing point, thereby improving the numerical accuracy of the STA.

21. A program storage device readable by a machine, tangibly embodying a program of instructions executable by the machine to perform method steps for selecting timing points in an electrical interconnect network to be used in electrical simulations used in a static timing analysis (STA), the method comprising:
   a) using a computer, inputting the electrical interconnect network and converting it into a graph;
   b) augmenting the graph by adding a first set of edges to connect all vertices of a selected logical port and a second set of edges to connect all the vertices of all other logical ports;
   c) partitioning the graph into biconnected components and articulation vertices, wherein one biconnected component comprises all of the vertices of the selected logical port, and a second biconnected component comprises all of the vertices of all the other logical ports;
   d) determining if the selected logical port's biconnected component is separate from the other port's biconnected component, and if the components are separate, then selecting an articulation vertex on a path from a first component to a second component as a timing point for the first component; and
   e) incorporating the selected articulation vertex into a selected port's timing point, thereby improving the numerical accuracy of the STA.

* * * * *